(12) United States Patent
Kang et al.

(10) Patent No.: US 9,775,253 B2
(45) Date of Patent: Sep. 26, 2017

(54) INSULATING FILM, PRINTED CIRCUIT BOARD USING THE SAME, AND METHOD OF MANUFACTURING THE PRINTED CIRCUIT BOARD

(71) Applicant: SAMSUNG ELECTRO-MECHANICS CO., LTD., Suwon-Si, Gyeonggi-Do (KR)

(72) Inventors: Dong Hun Kang, Suwon-Si (KR); Joung Suk Lee, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 14 days.

(21) Appl. No.: 14/699,808

(22) Filed: Apr. 29, 2015

(65) Prior Publication Data
US 2016/0037653 A1  Feb. 4, 2016

(30) Foreign Application Priority Data
Jul. 29, 2014  (KR) .................. 10-2014-0096672

(51) Int. Cl.
| | |
|---|---|
| *H05K 3/42* | (2006.01) |
| *H05K 3/46* | (2006.01) |
| *H05K 1/11* | (2006.01) |
| *H05K 1/02* | (2006.01) |
| *H05K 3/44* | (2006.01) |

(52) U.S. Cl.
CPC ........... *H05K 3/429* (2013.01); *H05K 1/0225* (2013.01); *H05K 1/115* (2013.01); *H05K 3/445* (2013.01); *H05K 2201/09509* (2013.01); *H05K 2203/061* (2013.01)

(58) Field of Classification Search
CPC ....... H05K 3/429; H05K 1/115; H05K 3/4647
USPC ............................. 174/262; 428/457; 29/852
See application file for complete search history.

(56) References Cited

U.S. PATENT DOCUMENTS

| 7,170,012 B2* | 1/2007 | Suwa ...................... H05K 3/44 174/254 |
|---|---|---|
| 8,519,270 B2* | 8/2013 | Chang ................. H05K 3/4697 174/250 |
| 8,872,350 B2* | 10/2014 | Sawachi ................ H01L 24/24 257/678 |
| 9,107,332 B2* | 8/2015 | Hu ........................ H05K 3/3452 |
| 2012/0168220 A1* | 7/2012 | Lee ........................ H05K 3/429 174/264 |
| 2016/0118337 A1* | 4/2016 | Yoon ................... H01L 23/5226 257/753 |

FOREIGN PATENT DOCUMENTS

KR          10-0274782 B1     1/2001

* cited by examiner

*Primary Examiner* — Timothy Thompson
*Assistant Examiner* — Charles Pizzuto
(74) *Attorney, Agent, or Firm* — NSIP Law

(57) ABSTRACT

There are provided an insulating film, a printed circuit board including the insulating film, and a method of manufacturing the printed circuit board. The insulating film includes a first insulating material; a second insulating material; and a metal thin film disposed between the first insulating material and the second insulating material.

16 Claims, 4 Drawing Sheets

INSULATING FILM, PRINTED CIRCUIT BOARD USING THE SAME, AND METHOD OF MANUFACTURING THE PRINTED CIRCUIT BOARD

CROSS-REFERENCE TO RELATED APPLICATION

This application claims the benefit of Korean Patent Application No. 10-2014-0096672, filed on Jul. 29, 2014, entitled "Insulating Film, Printed Circuit Board Including the Same, and Method of Manufacturing the Printed Circuit Board" which is hereby incorporated by reference in its entirety into this application.

BACKGROUND

The present disclosure relates to an insulating film, a printed circuit board using the insulating film, and a method of manufacturing the printed circuit board.

A demand for miniaturization of materials applied to boards is also increasing because of lightweight, thin, short, and small electronic devices. As specifications of electronic devices such as high functionality, high speed, etc. become higher, importance of boards capable of performing further stable and efficient signal transmission is also increasing. For stable and efficient signal transmission of boards, importance of a function of shielding noise due to a high frequency is further increasing. A process of additionally forming a ground layer is performed so as to shield noise for providing a stable signal transmission of a board and low impedance.

RELATED ART DOCUMENT

Patent Document (Patent Document 1) Korean Patent No. 0274782

SUMMARY

An aspect of the present disclosure may provide an insulating film capable of reducing the number of processes by omitting a process of additionally forming a ground layer, a printed circuit board including the insulating film, and a method of manufacturing the printed circuit board.

Another aspect of the present disclosure may provide an insulating film capable of shielding signal noise, a printed circuit board including the insulating film, and a method of manufacturing the printed circuit board.

Another aspect of the present disclosure may provide an insulating film capable of improving reliability of a signal transmission due to a reduction in a signal transmission distance, a printed circuit board including the insulating film, and a method of manufacturing the printed circuit board.

According to an aspect of the present disclosure, an insulating film may include: a first insulating material; a second insulating material; and a metal thin film disposed between the first insulating material and the second insulating material.

According to another aspect of the present disclosure, a printed circuit board may include: a board on which an inner layer buildup layer is formed; a first insulating layer formed on the inner layer buildup layer; a metal layer formed on the first insulating layer; a second insulating layer formed on the metal layer; a via formed to pass through the first insulating layer, the metal layer, and the second insulating layer and be in contact with an inner layer circuit layer of the inner layer buildup layer; and an insulating coating layer formed between the first insulating layer, the metal layer, and the second insulating layer and the via.

The metal layer may be formed to be in contact with an entire one surface of the first insulating layer.

The metal layer may be a ground layer.

According to another aspect of the present disclosure, a method of manufacturing a printed circuit board may include preparing a board on which an inner layer buildup layer is formed; forming an insulating film comprising a first insulating material, a second insulating material, and a metal thin film disposed between the first insulating material and the second insulating material, on the inner layer buildup layer; forming a via hole in the insulating film to expose a part of an inner layer circuit layer of the inner layer buildup layer; forming an insulating coating layer on the insulating film and a side wall of the via hole; and forming a via formed in the via hole and contacting the exposed inner layer circuit layer.

BRIEF DESCRIPTION OF DRAWINGS

The above and other aspects, features and other advantages of the present disclosure will be more clearly understood from the following detailed description taken in conjunction with the accompanying drawings, in which.

DESCRIPTION OF EMBODIMENTS

Figure 1:
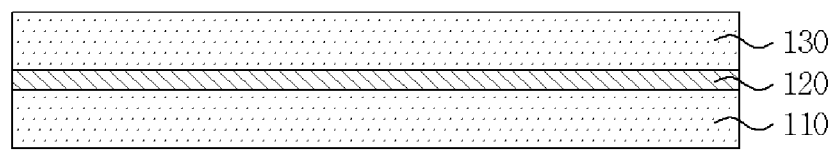
FIG. 1 is an exemplary diagram showing an insulating film according to an exemplary embodiment of the present disclosure.

The objects, features and advantages of the present disclosure will be more clearly understood from the following detailed description of the exemplary embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present disclosure, when it is determined that the detailed description of the related art would obscure the gist of the present disclosure, the description thereof will be omitted.

Hereinafter, exemplary embodiments of the present disclosure will be described in detail with reference to the accompanying drawings.

Insulating Film

FIG. 1 is an exemplary diagram showing an insulating film according to an exemplary embodiment of the present disclosure.

Referring to FIG. 1, the insulating film 100 according to an exemplary embodiment of the present disclosure includes a first insulating material 110, a second insulating material 130, and a metal thin film 120.

According to an exemplary embodiment of the present disclosure, the first insulating material 110 and the second insulating material 130 are complex polymer resin usually used as an interlayer insulating material. For example, the first insulating material 110 and the second insulating material 130 may be formed of epoxy based resin such as prepreg, ABF (Ajinomoto Build Up Film), FR4, BT (Bismaleimide Triazine), etc. The first insulating material 110 and the second insulating material 130 may be formed in the form of a film. However, the materials forming the first insulating material 110 and the second insulating material 130 and the shapes in the exemplary embodiment of the present disclosure are not limited as described above. That is, any insulating materials and shapes used in a circuit board field may be applied to the first insulating material 110 and the second insulating material 130.

According to an exemplary embodiment of the present disclosure, the metal thin film 120 is formed between the first insulating material 110 and the second insulating material 130. The metal thin film 120 may be formed of metal such as copper, silver, nickel, etc. In the exemplary embodiment of the present disclosure, the metal thin film 120 may be formed of copper. However, a material forming the metal thin film 120 is not limited to copper. That is, the material forming the metal thin film 120 may be possible if the material is a metal material having conductivity used in the circuit board field.

As such, the insulating film 100 according to an exemplary embodiment of the present disclosure has a structure in which the first insulating material 110, the metal thin film 120, and the second insulating material 130 are sequentially stacked. In this regard, the metal thin film 120 of the insulating film 100 performs the same function as a ground layer of a board. That is, if the insulating film 100 according to an exemplary embodiment of the present disclosure is applied to the board, noise is shielded by the metal thin film 120. Thus, a stable signal transmission between circuit patterns formed on the board may be possible.

A thickness of the insulating film 100 according to an exemplary embodiment of the present disclosure may be adjustable. That is, the entire thickness of the insulating film 100 may be adjustable by adjusting a thickness of the metal thin film 120 according to a board to which the insulating film 100 is to be applied.

Printed Circuit Board

Figure 2:
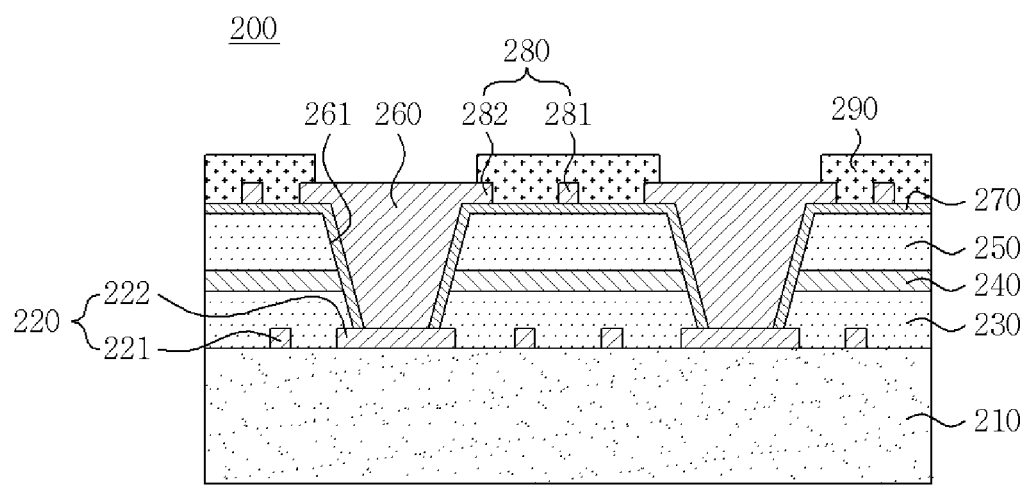
FIG. 2 is an exemplary diagram showing a printed circuit board according to an exemplary embodiment of the present disclosure.

FIG. 2 is an exemplary diagram showing a printed circuit board according to an exemplary embodiment of the present disclosure.

Referring to FIG. 2, the printed circuit board 200 according to an exemplary embodiment of the present disclosure includes a board 210, an inner layer buildup layer, a first insulating layer 230, a metal layer 240, a second insulating layer 250, a via 260, an insulating coating layer 270, an outer layer buildup layer, and a solder resist layer 290.

According to an exemplary embodiment of the present disclosure, the board 210 is complex polymer resin usually used as an interlayer insulating material. For example, the board 210 may manufacture a thinner printed circuit board 200 by employing prepreg. Alternatively, the board 210 may easily implement a fine circuit by employing ABF (Ajinomoto Build Up Film). In addition, the board 210 may use epoxy based resin such as FR4, BT (Bismaleimide Triazine), etc. but is not particularly limited thereto. The board 210 may be formed by using a copper clad laminate (CCL). The board 210 is configured as a single insulating layer in the exemplary embodiment of the present disclosure but the present disclosure is not limited thereto. That is, the board 210 may be configured as one or more insulating layers, a circuit layer, and a via.

According to an exemplary embodiment of the present disclosure, the inner layer buildup layer may be formed on the board 210. The inner layer buildup layer may include an inner layer circuit layer 220. The inner layer circuit layer 220 may include an inner layer circuit pattern 221 and a via pad 222. The inner layer circuit layer 220 is formed of a conductive material. For example, the inner layer circuit layer 220 may be formed of copper. However, a material forming the inner layer circuit layer 220 is not limited to copper. That is, the material forming the inner layer circuit layer 220 may be applied without restriction if the material is used as a conductive material for a circuit in the circuit board field. The inner layer buildup layer is configured as the inner layer circuit layer 220 of one layer in FIG. 2 but the configuration of the inner layer buildup layer is not limited thereto. For example, the inner layer buildup layer may be formed as the inner layer circuit layers 220 of multi layers and inner layer insulating layers (not shown) formed between the inner layer circuit layers 220 for insulating the inner layer circuit layers 220 from each other.

According to an exemplary embodiment of the present disclosure, the first insulating layer 230 is formed on the inner layer buildup layer. The first insulating layer 230 is formed of complex polymer resin usually used as an interlayer insulating material. For example, the first insulating layer 230 may be formed of epoxy based resin such as prepreg, ABF (Ajinomoto Build Up Film), FR4, BT (Bismaleimide Triazine), etc. However, the materials forming the first insulating layer 230 in the exemplary embodiment of the present disclosure are not limited as described above. That is, any insulating materials used in the circuit board field may be applied to the first insulating layer 230.

According to an exemplary embodiment of the present disclosure, the metal layer 240 is formed on the first insulating layer 230. According to an exemplary embodiment of the present disclosure, the metal layer 240 is formed to contact an entire one surface of the first insulating layer 230. Referring to FIG. 2, the metal layer 240 is continuously formed on the first insulating layer 230 except for a part in which the via 260 is formed. The metal layer 240 is formed of metal such as copper, silver, nickel, etc. In the exemplary embodiment of the present disclosure, the metal layer 240 may be formed of copper. However, a material forming the metal layer 240 is not limited to copper. That is, the material forming the metal layer 240 may be possible if the material is a metal material having conductivity used in the circuit board field. According to an exemplary embodiment of the present disclosure, the above-formed metal layer 240 is a ground layer.

According to an exemplary embodiment of the present disclosure, the second insulating layer 250 is formed on the metal layer 240. The second insulating layer 250 is formed of complex polymer resin usually used as an interlayer insulating material. For example, the second insulating layer 250 may be formed of epoxy based resin such as prepreg, ABF (Ajinomoto Build Up Film), FR4, BT (Bismaleimide Triazine), etc. However, the materials forming the second insulating layer 250 in the exemplary embodiment of the present disclosure are not limited as described above. That is, any insulating materials used in the circuit board field may be applied to the second insulating layer 250.

According to an exemplary embodiment of the present disclosure, the via 260 is formed to pass through the first insulating layer 230, the second insulating layer 250, and the metal layer 240. According to an exemplary embodiment of the present disclosure, one surface of the via 260 is in contact with the inner layer circuit layer 220 of the inner layer buildup layer. Another surface of the via 260 is in contact with the outer layer circuit layer 280 of the outer layer buildup layer. The above-formed via 260 electrically connects the inner layer buildup layer and the outer layer buildup layer. According to an exemplary embodiment of the present disclosure, the via 260 may be formed of copper. However, a material forming the via 260 is not limited to copper. That is, the material forming the via 260 may be possible if the material is a conductive material used in the circuit board field.

According to an exemplary embodiment of the present disclosure, the insulating coating layer 270 is formed between the first insulating layer 230, the second insulating layer 250, the metal layer 240, and the via 260. The insulating coating layer 270 is formed to insulate between the via 260 and the metal layer 240. The insulating coating layer 270 prevents residues of the first insulating layer 230 and the second insulating layer 250 that occur when forming a via hole (not shown) for the via 260 or a defect caused by a burr. In this regard, the insulating coating layer 270 is not formed between the via 260 and the inner layer buildup layer or the outer layer buildup layer for an electrical connection between the via 260 and the inner layer buildup layer or the outer layer buildup layer.

According to an exemplary embodiment of the present disclosure, the insulating coating layer 270 is formed of complex polymer resin usually used as an interlayer insulating material. For example, the insulating coating layer 270 may be formed of epoxy based resin such as prepreg, ABF (Ajinomoto Build Up Film), FR4, BT (Bismaleimide Triazine), etc. However, the materials forming the insulating coating layer 270 in the exemplary embodiment of the present disclosure are not limited as described above. That is, any insulating materials used in the circuit board field may be applied to the insulating coating layer 270.

According to an exemplary embodiment of the present disclosure, the outer layer buildup layer is formed on the second insulating layer 250 and the via 260. The outer layer buildup layer includes the outer layer circuit layer 280. The outer layer circuit layer 280 includes an outer layer circuit pattern 281 and an external connection pad 282.

According to an exemplary embodiment of the present disclosure, the external connection pad 282 is a component electrically connected to the outside through an external connection terminal, etc. For example, the external connection terminal may be a solder ball.

According to an exemplary embodiment of the present disclosure, the outer layer circuit layer 280 is formed of a conductive material. For example, the outer layer circuit layer 280 may be formed of copper. However, a material forming the outer layer circuit layer 280 is not limited to copper. That is, if a material is used as a conductive material for a circuit in the circuit board field, the material may be applied to the outer layer circuit layer 280 without restriction.

The outer layer buildup layer is configured as the outer layer circuit layer 280 of one layer in FIG. 2 but the configuration of the outer layer buildup layer is not limited thereto. For example, the outer layer buildup layer may be formed as the outer layer circuit layers 280 of multi layers and outer layer insulating layers (not shown) formed between the outer layer circuit layers 280 for insulating the outer layer circuit layers 280 from each other.

According to an exemplary embodiment of the present disclosure, the solder resist layer 290 is formed on the outer layer buildup layer. The solder resist layer 290 is formed to prevent solder from being coated on the outer layer circuit pattern 281 or oxidized when a soldering process is performed. The solder resist layer 290 is formed to surround the outer layer circuit pattern 281 and expose the outer connection pad 282. For example, the solder resist layer 290 is formed of a heat resisting sheath material.

The printed circuit board 200 according to an exemplary embodiment of the present disclosure shields signal noise since the metal layer 240 performs a function of a ground layer. Thus, a stable signal transmission is possible between a circuit pattern formed on the printed circuit board 200 and an electronic component (not shown) connected to the printed circuit board 200 later. In the printed circuit board 200 according to an exemplary embodiment of the present disclosure, the via 260 passes through the metal layer 240 and is directly connected to the inner layer circuit layer 220 and the outer layer circuit layer 280. Thus, a signal transfer distance between the inner layer circuit layer 220 and the outer layer circuit layer 280 is reduced, thereby improving performance of a signal transmission.

Method of Manufacturing a Printed Circuit Board

FIGS. 3 through 10 are exemplary diagrams for explaining a method of manufacturing a printed circuit board according to an exemplary embodiment of the present disclosure.

Figure 3:
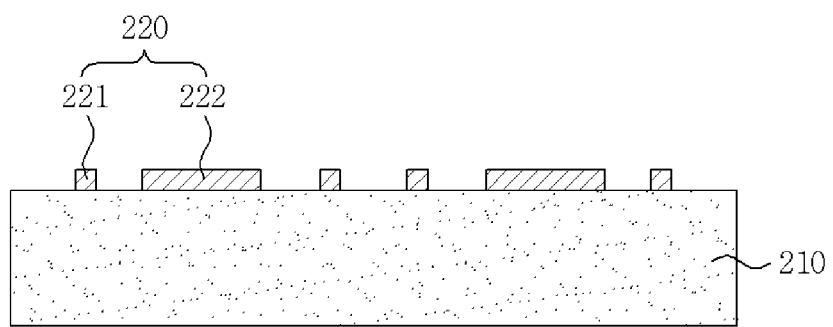
FIGS. 3 through 10 are exemplary diagrams for explaining a method of manufacturing a printed circuit board according to an exemplary embodiment of the present disclosure.

Referring to FIG. 3, the board 210 on which an inner layer buildup layer is formed is prepared.

The board 210 according to an exemplary embodiment of the present disclosure is complex polymer resin usually used as an interlayer insulating material. For example, the board 210 may manufacture a thinner printed circuit board 200 by employing prepreg. Alternatively, the board 210 may easily implement a fine circuit by employing ABF (Ajinomoto Build Up Film). In addition, the board 210 may use epoxy based resin such as FR4, BT (Bismaleimide Triazine), etc. but is not particularly limited thereto. The board 210 may be formed by using a copper clad laminate (CCL). The board 210 is configured as a single insulating layer in the exemplary embodiment of the present disclosure but the present disclosure is not limited thereto. That is, the board 210 may be configured as one or more insulating layers, a circuit layer, and a via.

According to an exemplary embodiment of the present disclosure, the inner layer buildup layer may be formed on the board 210. The inner layer buildup layer may include the inner layer circuit layer 220. The inner layer circuit layer 220 may include the inner layer circuit pattern 221 and the via pad 222. The via pad 222 is in contact with and is electrically connected to a via that is formed later.

According to an exemplary embodiment of the present disclosure, the inner layer circuit layer 220 is formed of a conductive material. For example, the inner layer circuit layer 220 may be formed of copper. However, a material forming the inner layer circuit layer 220 is not limited to copper. That is, the material forming the inner layer circuit layer 220 may be applied without restriction if the material is used as a conductive material for a circuit in the circuit board field. The inner layer buildup layer is configured as the inner layer circuit layer 220 of one layer in FIG. 3 but the configuration of the inner layer buildup layer is not limited thereto. For example, the inner layer buildup layer may be formed as the inner layer circuit layers 220 of multi layers and inner layer insulating layers (not shown) formed between the inner layer circuit layers 220 for insulating the inner layer circuit layers 220 from each other.

Figure 4:
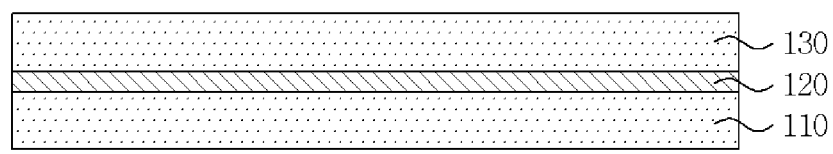

Referring to FIG. 4, the insulating film 100 is prepared.

According to an exemplary embodiment of the present disclosure, the insulating film 100 includes the first insulating material 110, the second insulating material 130, and the metal thin film 120.

According to an exemplary embodiment of the present disclosure, the first insulating material 110 and the second insulating material 130 are formed of complex polymer resin usually used as an interlayer insulating material. For example, the first insulating material 110 and the second insulating material 130 may be formed of epoxy based resin such as prepreg, ABF (Ajinomoto Build Up Film), FR4, BT (Bismaleimide Triazine), etc. The first insulating material 110 and the second insulating material 130 may be formed in the form of a film. However, the materials forming the first insulating material 110 and the second insulating material 130 and the shapes in the exemplary embodiment of the present disclosure are not limited as described above. That is, any insulating materials and shapes used in a circuit board field may be applied to the first insulating material 110 and the second insulating material 130.

According to an exemplary embodiment of the present disclosure, the metal thin film 120 is formed between the first insulating material 110 and the second insulating material 130. The metal thin film 120 may be formed of metal such as copper, silver, nickel, etc. In the exemplary embodiment of the present disclosure, the metal thin film 120 may be formed of copper. However, a material forming the metal thin film 120 is not limited to copper. That is, the material forming the metal thin film 120 may be possible if the material is a metal material having conductivity.

As such, the insulating film 100 according to an exemplary embodiment of the present disclosure has a structure in which the first insulating material 110, the metal thin film 120, and the second insulating material 130 are sequentially stacked.

Figure 5:
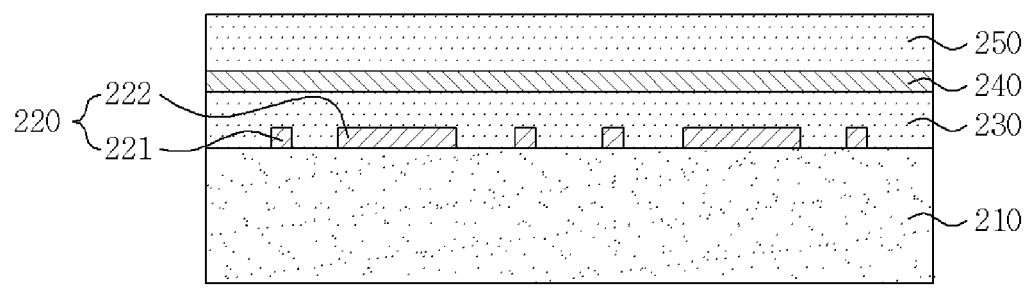

Referring to FIG. 5, an insulating film (100 of FIG. 4) is stacked on an inner layer buildup layer.

According to an exemplary embodiment of the present disclosure, the insulating film (100 of FIG. 4) is pressurized after being positioned on the inner layer circuit layer 220 of the inner layer buildup layer.

According to an exemplary embodiment of the present disclosure, a first insulating material (110 of FIG. 4) of the insulating film (100 of FIG. 4) formed on the inner layer buildup layer is the first insulating layer 230 of the printed circuit board 200. A second insulating material (130 of FIG. 4) of the insulating film (100 of FIG. 4) formed on the inner layer buildup layer is the second insulating layer 250 of the printed circuit board 200. The metal thin film 120 of the insulating film (100 of FIG. 4) is the metal layer 240 of the printed circuit board 200 and functions as a ground layer.

Figure 6:
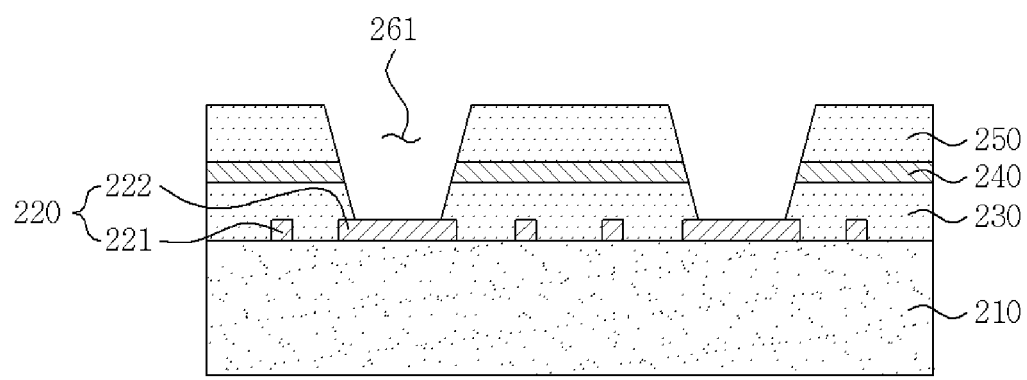

Referring to FIG. 6, the via hole 261 may be formed.

The via hole 261 according to an exemplary embodiment of the present disclosure may pass through the first insulating layer 230, the metal layer 240, and the second insulating layer 250 and expose the via pad 222 of the inner layer buildup layer. According to an exemplary embodiment of the present disclosure, the via hole 261 may be formed by using a Yag laser drill. However, a method of forming the via hole 261 is not limited to using the Yag laser drill. The via hole 261 may be formed by using one of a router and laser drill.

Figure 7:
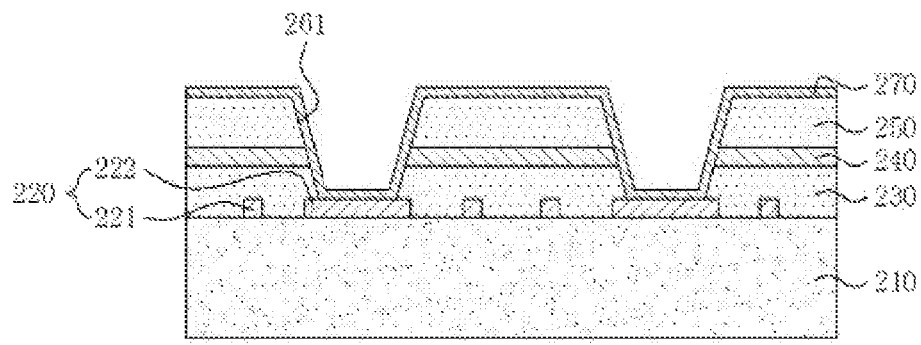

Referring to FIG. 7, the insulating coating layer 270 is formed.

The insulating coating layer 270 according to an exemplary embodiment of the present disclosure is formed in an inner wall of the via hole 261 and the via pad 222 exposed by the via hole 261. The insulating coating layer 270 is formed to insulate the metal layer 240 and a via (260 of FIG. 9) that is to be formed in the via hole 261 later.

The insulating coating layer 270 according to an exemplary embodiment of the present disclosure is formed of complex polymer resin usually used as an interlayer insulating material. For example, the insulating coating layer 270 may be formed of epoxy based resin such as prepreg, ABF (Ajinomoto Build Up Film), FR4, BT (Bismaleimide Triazine), etc. However, the materials forming the insulating coating layer 270 in the exemplary embodiment of the present disclosure are not limited as described above. That is, any insulating materials used in the circuit board field may be applied to the insulating coating layer 270.

The above-formed insulating coating layer 270 prevents residues of the first insulating layer 230 and the second insulating layer 250 that occur when forming the via hole 261 or a reliability degradation due to a defect caused by a burr.

Figure 8:
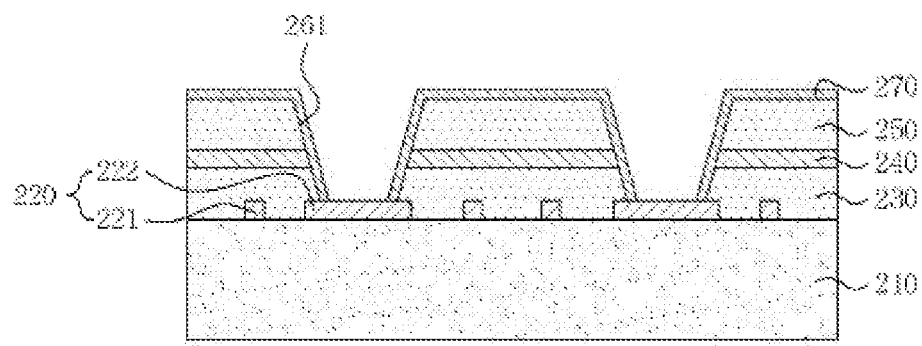

Referring to FIG. 8, the insulating coating layer 270 formed in the via pad 222 is removed. According to an embodiment of the present disclosure, the insulating coating layer 270 formed in the via pad 222 is removed for an electrical connection between the via pad 222 and a via (260 of FIG. 9) formed in the via hole 261 later. For example, the insulating coating layer 270 may be removed by using a $CO_2$ laser drill. However, a method of removing the insulating coating layer 270 is not limited to using the $CO_2$ laser drill. The insulating coating layer 270 may be removed by applying one of methods of removing an insulating material known in the circuit board field. Insulating residues of the via pad 222 may be removed by further performing a desmear process after removing the insulating coating layer 270 by using a laser drill, etc.

Figure 9:
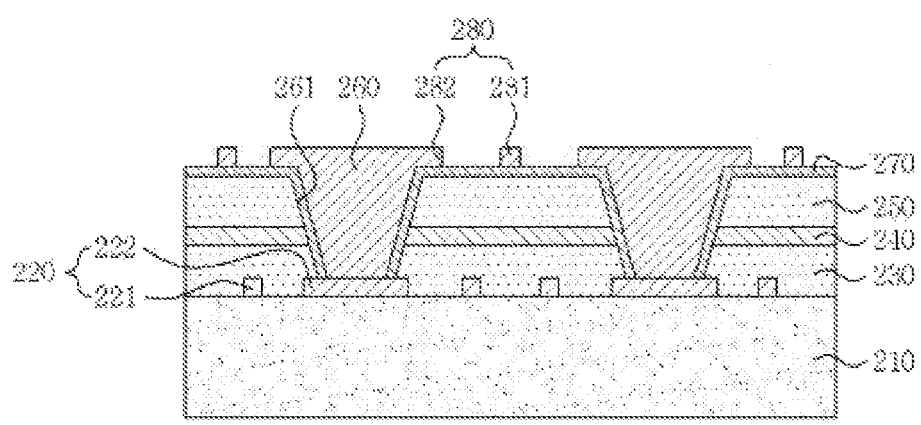

Referring to FIG. 9, the via 260 and the outer layer buildup layer are formed.

According to an exemplary embodiment of the present disclosure, the via 260 is formed inside the via hole 261. That is, the via 260 is formed to pass through the first insulating layer 230, the second insulating layer 250, and the metal layer 240. According to an exemplary embodiment of the present disclosure, one surface of the via 260 is in contact with the inner layer circuit layer 220 of the inner layer buildup layer. Another surface of the via 260 is in contact with the outer layer circuit layer 280 of the outer layer buildup layer. The above-formed via 260 electrically connects the inner layer buildup layer and the outer layer buildup layer. According to an exemplary embodiment of the present disclosure, the via 260 may be formed of copper. However, a material forming the via 260 is not limited to copper. That is, the material forming the via 260 may be possible if the material is a conductive material.

According to an exemplary embodiment of the present disclosure, the outer layer buildup layer is formed on the second insulating layer 250 and the via 260. The outer layer buildup layer includes the outer layer circuit layer 280. The outer layer circuit layer 280 includes an outer layer circuit pattern 281 and an external connection pad 282. In this regard, the external connection pad 282 is a component electrically connected to the outside through an external connection terminal, etc. For example, the external connection terminal may be a solder ball.

According to an exemplary embodiment of the present disclosure, the outer layer circuit layer 280 is formed of a conductive material. For example, the outer layer circuit layer 280 may be formed of copper. However, a material forming the outer layer circuit layer 280 is not limited to copper. That is, if a material is used as a conductive material for a circuit in the circuit board field, the material may be applied to the outer layer circuit layer 280 without restriction.

According to an exemplary embodiment of the present disclosure, the via 260 and the outer layer circuit layer 280 may be simultaneously formed by using plating resist (not shown) or etching resist (not shown). The via 260 and the outer layer circuit layer 280 may be individually formed. The via 260 and the outer layer circuit layer 280 according to an exemplary embodiment of the present disclosure may be formed by using methods of forming a circuit pattern and a via known to the circuit board field.

In the exemplary embodiment of the present disclosure, the outer layer circuit layer 280 of one layer is formed in the via 260. However, the outer layer buildup layer is configured as the outer layer circuit layer 280 of one layer but the configuration of the outer layer buildup layer is not limited thereto. For example, the outer layer buildup layer may be formed as the outer layer circuit layers 280 of multi layers and outer layer insulating layers (not shown) formed between the outer layer circuit layers 280 for insulating the outer layer circuit layers 280 from each other.

In the related art, processes of forming an insulating layer, exposure, development, etching, and plating need to be performed so as to form a ground layer. However, according to an exemplary embodiment of the present disclosure, the ground layer may be formed by only stacking the insulating film 100 in which the metal thin film 120 is interposed without a separate process. Thus, the method of manufacturing the printed circuit board 200 using the insulating film 100 according to an exemplary embodiment of the present disclosure reduces the number of processes compared to the related art. The method of manufacturing the printed circuit board 200 using the insulating film 100 according to an exemplary embodiment of the present disclosure may save cost expense owing to the reduction in the number of processes.

The above-formed printed circuit board 200 shields signal noise since the metal layer 240 performs a function of the ground layer. Thus, a stable signal transmission is possible between a circuit pattern formed on the printed circuit board 200 and an electronic component (not shown) connected to the printed circuit board 200 later. In the printed circuit board 200 formed according to an exemplary embodiment of the present disclosure, the via 260 passes through the metal layer 240 and is directly connected to the inner layer circuit layer 220 and the outer layer circuit layer 280. Thus, a distance of a signal transmission between the inner layer circuit layer 220 and the outer layer circuit layer 280 is reduced, thereby improving performance of the signal transmission.

Figure 10:
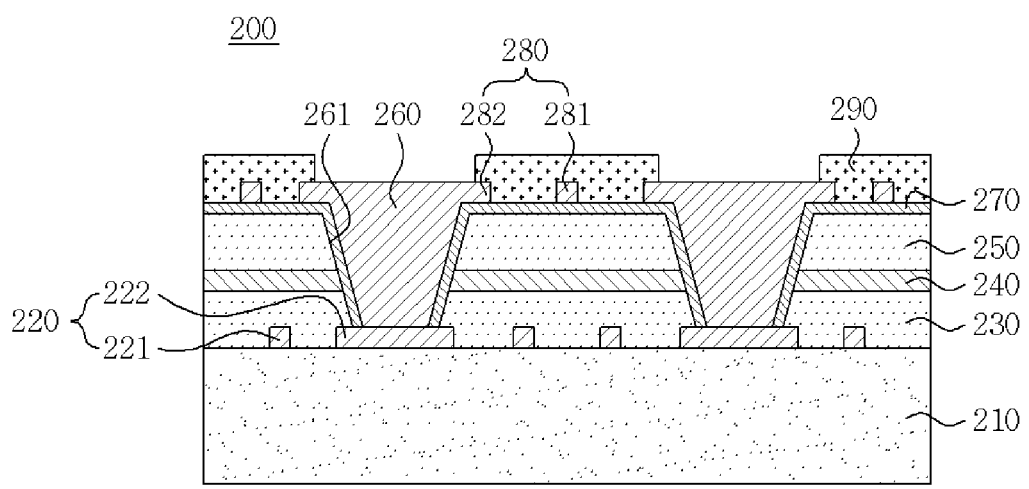

Referring to FIG. 10, the solder resist layer 290 is formed.

The solder resist layer 290 according to an exemplary embodiment of the present disclosure is formed on the outer layer buildup layer. The solder resist layer 290 is formed to prevent solder from being coated on the outer layer circuit pattern 281 or oxidized when a soldering process is performed. The solder resist layer 290 is formed to surround the outer layer circuit pattern 281 and expose the outer connection pad 282. For example, the solder resist layer 290 is formed of a heat resisting sheath material.

Although the embodiments of the present disclosure have been disclosed for illustrative purposes, it will be appreciated that the present disclosure is not limited thereto, and those skilled in the art will appreciate that various modifications, additions and substitutions are possible, without departing from the scope and spirit of the disclosure.

Accordingly, any and all modifications, variations or equivalent arrangements should be considered to be within the scope of the disclosure, and the detailed scope of the disclosure will be disclosed by the accompanying claims.

What is claimed is:

1. A printed circuit board comprising:
   a board on which a buildup layer is formed;
   a first insulating layer formed on the buildup layer;
   a metal layer formed on the first insulating layer;
   a second insulating layer formed on the metal layer;
   a via formed to pass through the first insulating layer, the metal layer, and the second insulating layer and be in contact with a circuit layer of the buildup layer; and
   an insulating coating layer formed between the first insulating layer, the metal layer, and the second insulating layer and the via.

2. The printed circuit board of claim 1, wherein the metal layer is formed to be in contact with an entire one surface of the first insulating layer.

3. The printed circuit board of claim 1, wherein the metal layer is a ground layer.

4. The printed circuit board of claim 1, wherein the buildup layer includes one or more layers of the circuit layer.

5. The printed circuit board of claim 1, further comprising a solder resist layer formed on the second insulating layer.

6. The printed circuit board of claim 1, further comprising an outer layer buildup layer formed on the second insulating layer and including one or more layers of an outer layer circuit layer.

7. The printed circuit board of claim 6, further comprising a solder resist layer formed on the outer layer buildup layer.

8. A method of manufacturing a printed circuit board, the method comprising:
   preparing a board on which an inner layer buildup layer is formed;
   forming an insulating film including a first insulating material, a second insulating material, and a metal thin film disposed between the first insulating material and the second insulating material, on the inner layer buildup layer;
   forming a via hole in the insulating film to expose a part of an inner layer circuit layer of the inner layer buildup layer;
   forming an insulating coating layer on the insulating film and a side wall of the via hole; and
   forming a via formed in the via hole and contacting the exposed inner layer circuit layer.

9. The method of claim 8, wherein the forming of the via hole includes forming the via hole by using a router or a laser drill.

10. The method of claim 8, wherein the forming of the insulating coating layer includes: forming the insulating coating layer on the insulating film, an inner wall of the via hole, and the exposed inner layer circuit layer; and
    removing the insulating coating layer formed on the inner layer circuit layer.

11. The method of claim 10, wherein, in the removing of the insulating coating layer formed on the inner layer circuit layer, the insulating coating layer is removed by using a laser drill.

12. The method of claim 8, further comprising, after the forming of the insulating coating layer, performing desmear.

13. The method of claim 8, further comprising, after the forming of the via, forming a solder resist layer on the insulating film.

14. The method of claim 8, wherein the inner layer buildup layer includes one or more layers of the inner layer circuit layer.

15. The method of claim 8, further comprising, after the forming of the via, forming an outer layer buildup layer including one or more layers of outer layer circuit layer on the insulating films.

16. The method of claim 15, further comprising, after the forming of the outer layer buildup layer, forming a solder resist layer on the outer layer buildup layer.

* * * * *